US012696595B2

(12) United States Patent
Joo et al.

(10) Patent No.: US 12,696,595 B2
(45) Date of Patent: Jul. 28, 2026

(54) DISPLAY DEVICE AND METHOD OF MANUFACTURING THE SAME

(71) Applicant: Samsung Display Co., LTD., Yongin-si (KR)

(72) Inventors: Sun-Kyu Joo, Suwon-si (KR); Keunchan Oh, Hwaseong-si (KR); Jun-Woo Hyung, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 464 days.

(21) Appl. No.: 18/298,420

(22) Filed: Apr. 11, 2023

(65) Prior Publication Data

US 2023/0387359 A1 Nov. 30, 2023

(30) Foreign Application Priority Data

May 25, 2022 (KR) ........................ 10-2022-0064237

(51) Int. Cl.
*H10H 20/851* (2025.01)
*H10H 20/01* (2025.01)
(52) U.S. Cl.
CPC ..... *H10H 20/8514* (2025.01); *H10H 20/0361* (2025.01)
(58) Field of Classification Search
None
See application file for complete search history.

(56) References Cited

U.S. PATENT DOCUMENTS

| | | | |
|---|---|---|---|
| 2020/0266243 A1 | 8/2020 | Kim et al. | |
| 2021/0376020 A1* | 12/2021 | Ahn | .................... H10K 59/8723 |
| 2022/0091445 A1 | 3/2022 | Yoon et al. | |

FOREIGN PATENT DOCUMENTS

| | | |
|---|---|---|
| KR | 10-1007717 | 1/2011 |
| KR | 10-1840777 | 3/2018 |
| KR | 20200100903 A | 8/2020 |
| KR | 10-2021-0114080 | 9/2021 |
| KR | 10-2021-0147123 | 12/2021 |
| KR | 20220039963 A | 3/2022 |

OTHER PUBLICATIONS

Office Action dated Mar. 6, 2026 for Korean Patent Application No. 10-2022-0064237, 12 pages.

\* cited by examiner

*Primary Examiner* — Bo B Jang
(74) *Attorney, Agent, or Firm* — CANTOR COLBURN LLP

(57) ABSTRACT
A display device includes a substrate, a partition layer disposed on the substrate, and comprising a first accommodating opening, a second accommodating opening, a third accommodating opening, and a spacer area spaced apart from the first accommodating opening and the second accommodating opening, a first color conversion layer disposed in the first accommodating opening, a second color conversion layer disposed in the third accommodating opening, a scattering layer disposed in the third accommodating opening, and a spacer disposed on the spacer area of the partition layer. The spacer and the scattering layer comprises a same material.

18 Claims, 11 Drawing Sheets

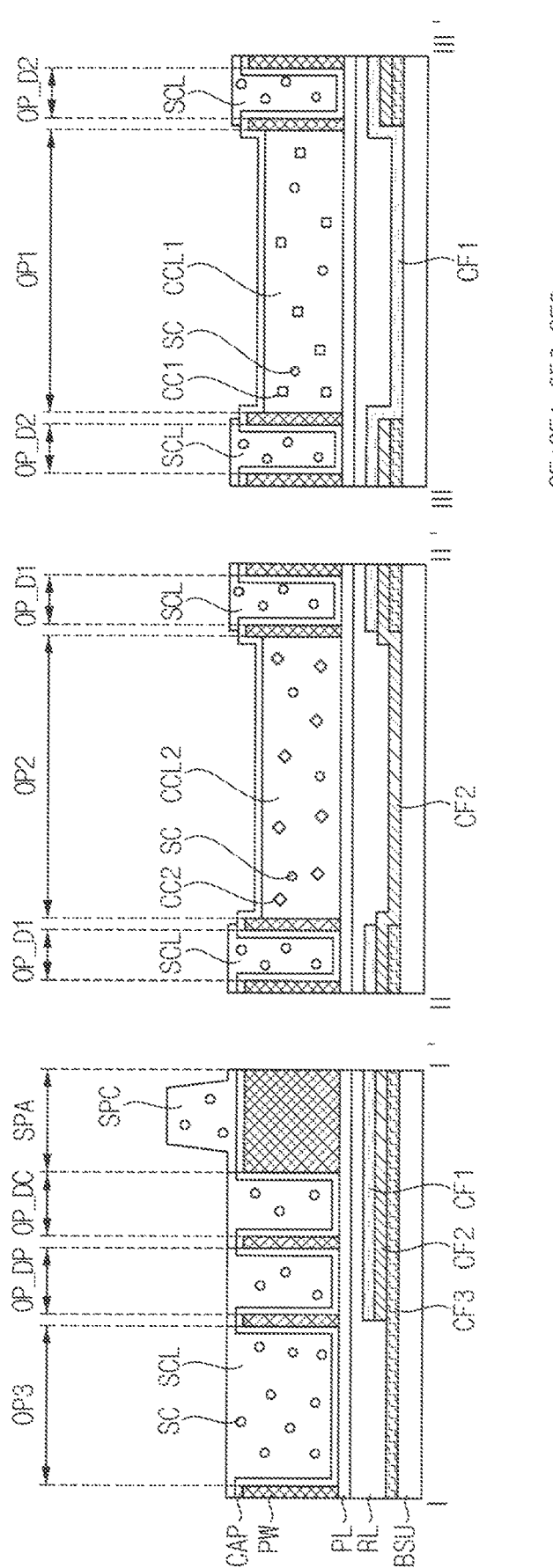
F I G . 10

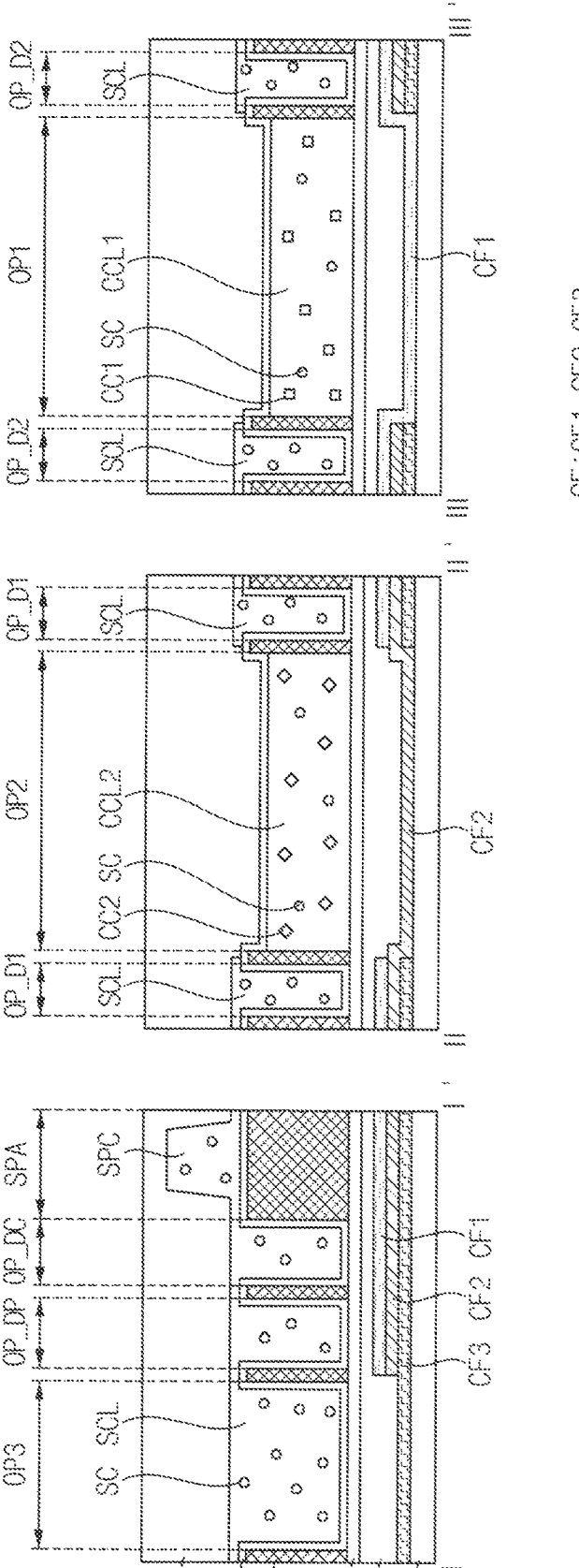
F I G. 11

DISPLAY DEVICE AND METHOD OF MANUFACTURING THE SAME

CROSS-REFERENCE TO RELATED APPLICATION

This application claims priority from and the benefit of Korean Patent Application No. 10-2022-0064237 under 35 U.S.C. § 119, filed on May 25, 2022, in the Korean Intellectual Property Office (KIPO), the entire contents of which are incorporated herein by reference.

BACKGROUND

1. Technical Field

Embodiments provide generally to a display device and a method of manufacturing the same.

2. Description of the Related Art

A display device is a device which displays an image, and may include a pixel which is a minimum unit for displaying an image, and a color conversion layer overlapping the pixel. The color conversion layer may include a color conversion material which converts wavelength of light emitted from the pixel, and accordingly, the light emitted from the pixel may be converted into light having various colors.

The color conversion layer may be disposed in an accommodating opening formed in a partition layer. In this case, in case that an area of the accommodating opening is relatively small in order to display a high-resolution image in a limited display area, it may be difficult to form the color conversion layer in the accommodating opening.

SUMMARY

Embodiments provide a display device capable of displaying a high-resolution image in a limited display area.

A display device according to embodiments of the disclosure may include a substrate, a partition layer disposed on the substrate, and comprising a first accommodating opening, a second accommodating opening, a third accommodating opening, and a spacer area spaced apart from the first accommodating opening and the second accommodating opening, a first color conversion layer disposed in the first accommodating opening, a second color conversion layer disposed in the third accommodating opening, a scattering layer disposed in the third accommodating opening, and a spacer disposed on the spacer area of the partition layer. The spacer and the scattering layer may comprise a same material.

In an embodiment, the scattering layer and the spacer may include a scattering material.

In an embodiment, the partition layer may further comprise a first dummy opening disposed between the second accommodating opening and the third accommodating opening, and a second dummy opening disposed between the first accommodating opening and the second accommodating opening and between the first accommodating opening and the third accommodating opening.

In an embodiment, the scattering layer may be further disposed in the first dummy opening and the second dummy opening.

In an embodiment, the partition wall may further comprise a fourth accommodating opening. The fourth accommodating opening may be surrounded by the first accommodating opening, the second accommodating opening, and the third accommodating opening, and may include a central dummy opening and a plurality of peripheral dummy openings surrounding the central dummy opening.

In an embodiment, the spacer area may be a portion of the partition wall adjacent to the central dummy opening.

In an embodiment, the scattering layer may be further disposed in the fourth accommodating opening.

In an embodiment, the display device may further include a capping layer covering the partition wall, the first color conversion layer, and the second color conversion layer.

In an embodiment, the capping layer may be further disposed between the partition wall and the scattering layer in the third accommodating opening.

In an embodiment, a planar area of the first accommodating opening may be larger than a planar area of the second accommodating opening, and the planar area of the second accommodating opening may be larger than a planer area of the third accommodating opening.

In an embodiment, the display device may further include a filling layer covering the partition wall, the first color conversion layer, the second color conversion layer, the scattering layer, and the spacer.

A method of manufacturing a display device according to embodiments of the disclosure may include forming a pre-partition wall on a substrate, forming a partition wall comprising a first accommodating opening, a second accommodating opening, a third accommodating opening, and a spacer area spaced apart from the first accommodating opening and the second accommodating opening by removing a first portion of the pre-partition wall, forming a first color conversion layer in the first accommodating opening, forming a second color conversion layer in the second accommodating opening, applying a photoresist material entirely on the substrate to cover the partition wall, the first color conversion layer, and the second color conversion layer, and forming a scattering layer disposed in the third accommodating opening and a spacer disposed on the spacer area of the partition wall at the same time by removing a portion of the photoresist material.

In an embodiment, the forming of the first color conversion layer may include supplying a first ink comprising a first color conversion material into the first accommodating opening by an inkjet method, and the forming of the second color conversion layer may include supplying a second ink comprising a second color conversion material into the second accommodating opening by an inkjet method.

In an embodiment, the method may further include after the forming of the second color conversion layer, forming the capping layer covering the substrate, the partition wall, the first color conversion layer, and the second color conversion layer.

In an embodiment, the photoresist material may be applied onto the capping layer.

In an embodiment, the photoresist material may include a scattering material.

In an embodiment, the forming of the partition wall may further include forming a first dummy opening disposed between the second accommodating opening and the third accommodating opening, and a second dummy opening disposed between the first accommodating opening and the third accommodating opening by removing second portion of the pre-partition wall.

In an embodiment, the forming of the partition wall may further include forming a fourth accommodating opening surrounded by the first accommodating opening, the second accommodating opening, and the third accommodating opening, and comprising a central dummy opening and a plurality of peripheral dummy openings surrounding the central dummy opening by removing a third portion of the pre-partition wall.

In an embodiment, the scattering layer may be further disposed in the first dummy opening, the second dummy opening, and the fourth accommodating opening.

In an embodiment, the method may further include forming a filling layer covering the partition wall, the first color conversion layer, the second color conversion layer, the scattering layer, and the spacer.

A method of manufacturing a display device according to embodiments of the disclosure may include applying a photoresist material entirely on a substrate, and forming a scattering layer disposed in a third accommodating opening and a spacer disposed on a spacer area of a partition wall at the same time by removing a portion of the photoresist material. Accordingly, even if a planar area of the third accommodating opening is relatively small, the scattering layer may be effectively formed in the third accommodating opening. In addition, since the scattering layer and the spacer are simultaneously formed without separately forming the scattering layer and the spacer, a manufacturing yield of the display device may be relatively high.

BRIEF DESCRIPTION OF THE DRAWINGS

Illustrative, non-limiting embodiments will be more clearly understood from the following detailed description in conjunction with the accompanying drawings.

FIGS. 2 and 3 are schematic diagrams illustrating an upper structure included in the display device of FIG. 1.

FIGS. 6 to 11 are schematic diagrams illustrating a method of manufacturing an upper structure of FIG. 3.

DETAILED DESCRIPTION OF THE EMBODIMENTS

Figure 1:
FIG. 1 is a schematic perspective view illustrating a display device according to an embodiment.
Figure 1:
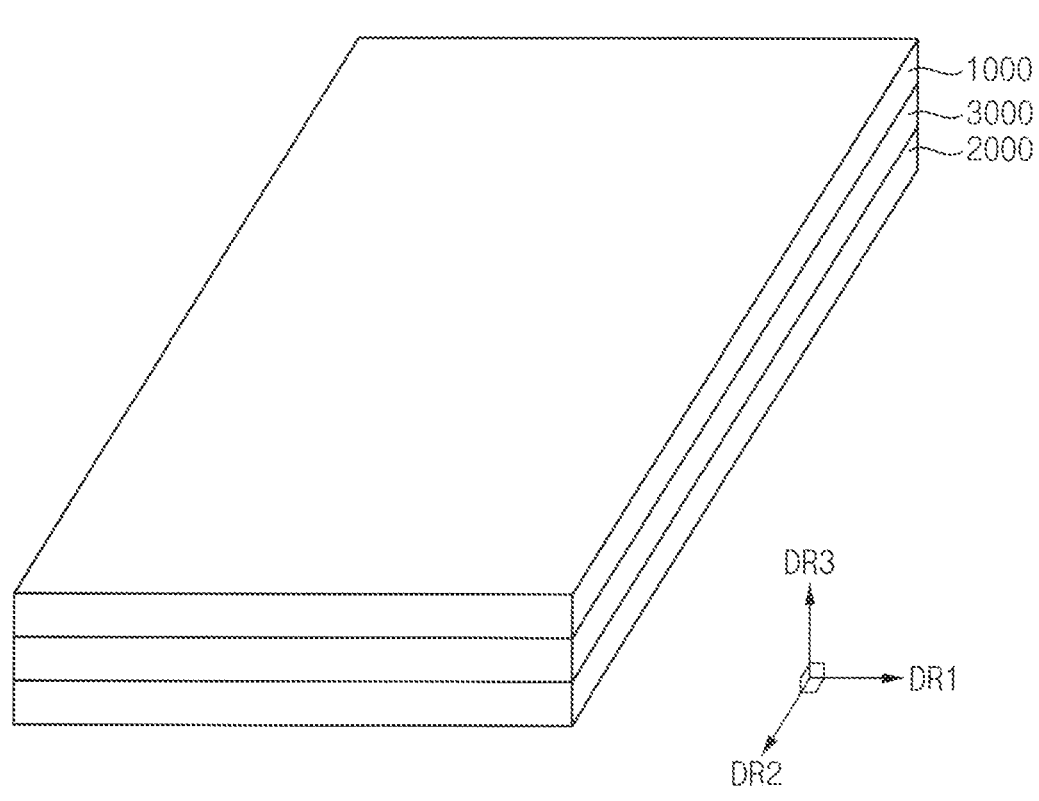

Hereinafter, embodiments of the disclosure will be explained in detail with reference to the accompanying drawings. The same reference numerals are used for the same components in the drawings, and redundant descriptions of the same components will be omitted.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic perspective view illustrating a display device according to an embodiment.

Referring to FIG. 1, a display device DD may include an upper structure 1000, a lower structure 2000, and a filling layer 3000.

The lower structure 2000 may include a pixel which is a minimum unit for emitting light. The upper structure 1000 may be disposed on the lower structure 2000. The upper structure 1000 may include a color conversion layer converting wavelength of light emitted from the pixel, and a scattering layer scattering light emitted from the pixel. The filling layer 3000 may be disposed between the upper structure 1000 and the lower structure 2000. The filling layer 3000 may provide adhesive strength so that the lower structure 2000 may be attached under the upper structure 1000.

Figure 2:
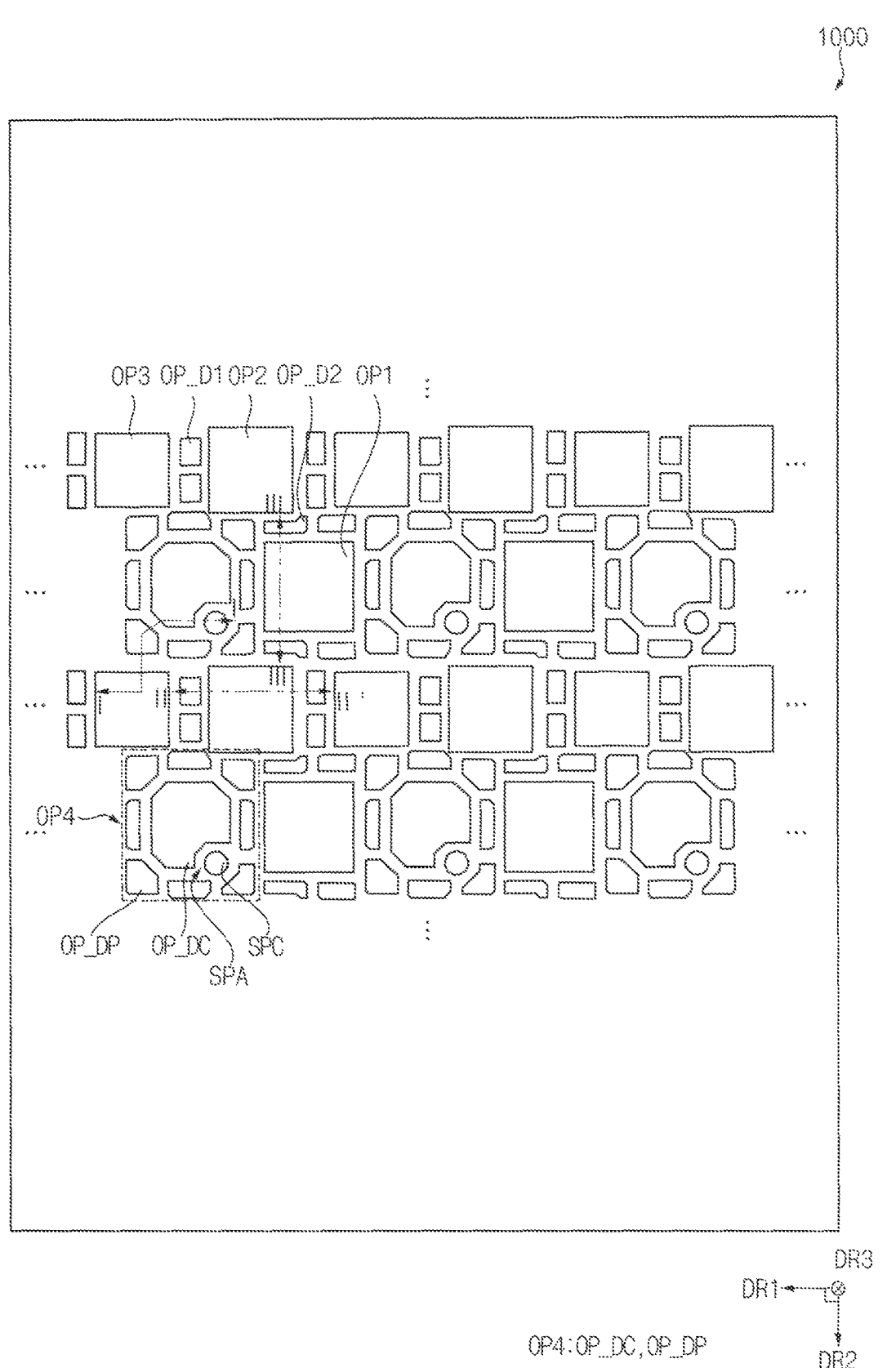
Figure 3:
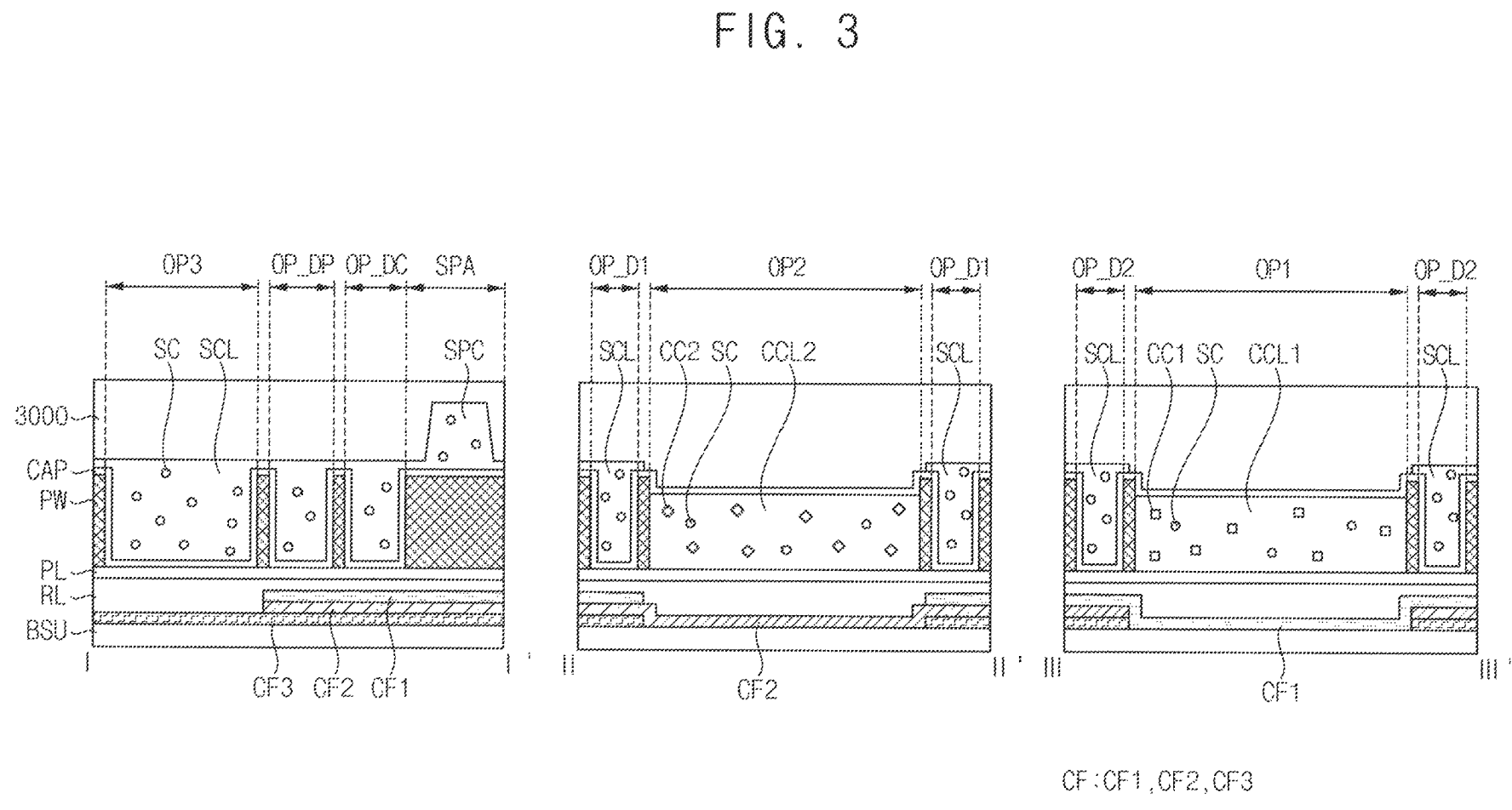

FIGS. 2 and 3 are schematic diagrams illustrating an upper structure included in the display device of FIG. 1. FIG. 2 is a schematic plan view illustrating the upper structure 1000 as viewed in a third direction DR3, and FIG. 3 is a schematic cross-sectional view taken along lines I-I', and of FIG. 2.

Referring to FIG. 2, the upper structure 1000 may include openings and a spacer area SPA. The openings may include a first opening overlapping pixel openings PXG, PXR, and PXB (see FIG. 4) of the lower structure 2000, and a second opening that does not overlap the pixel openings.

In an embodiment, the first opening may include a first accommodating opening OP1, a second accommodating opening OP2, and a third accommodating opening OP3, and the second opening may include a first dummy opening OP_D1, a second dummy opening OP_D2, and a forth accommodating opening OP4. The first accommodating opening OP1 may overlap a first pixel opening PXG (see FIG. 4), and the second accommodating opening OP2 may overlap a second pixel opening PXR (see FIG. 4), and the third accommodating opening OP3 may overlap a third pixel opening PXB (see FIG. 4).

The second accommodating opening OP2 and the third accommodating opening OP3 may be alternately arranged in a first direction DR1 intersecting the third direction DR3 to define a first opening row. The first accommodating opening OP1 and the fourth accommodating opening OP4 may be alternately arranged in the first direction DR1 to define a second opening row. The first opening row and the second opening row may be alternately arranged in a second direction DR2 intersecting the first direction DR1 and the third direction DR3.

In the first opening row, the first dummy opening OP_D1 may be disposed between the second accommodating opening OP2 and the third accommodating opening OP3. For example, as shown in FIG. 2, two first dummy openings OP_D1 may be disposed between one second accommodating opening OP2 and one third accommodating opening OP3 adjacent thereto.

The second dummy opening OP_D2 may be disposed between the first opening row and the first accommodating opening OP1. For example, as shown in FIG. 2, two second dummy openings OP_D2 may be disposed between one first accommodating opening OP1 and one first opening row adjacent thereto.

The fourth accommodating opening OP4 may include a central dummy opening OP_DC and a peripheral dummy opening OP_DP disposed around the central dummy opening OP_DC. For example, as shown in FIG. 2, the fourth accommodating opening OP4 may include one central dummy opening OP_DC and eight peripheral dummy openings OP_DP surrounding the one central dummy opening OP_DC.

In an embodiment, a planar area of the first accommodating opening OP1 may be larger than a planar area of the second accommodating opening OP2, and the planar area of the second accommodating opening OP2 may be larger than a planar area of the third accommodating opening OP3.

A spacer SPC may be disposed in the spacer area SPA. For example, the spacer area SPA may be defined as an area in which the spacer SPC is disposed. The spacer area SPA may be spaced apart from the first accommodating opening OP1 and the second accommodating opening OP2.

Referring to FIGS. 2 and 3, the upper structure 1000 may include an upper substrate BSU, a color filter layer CF, a refractive layer RL, a protective layer PL, a partition layer PW, a first color conversion layer CCL1, a second color conversion layer CCL2, a capping layer CAP, a scattering layer SCL, and the spacer SPC. The filling layer 3000 may be disposed on the upper structure 1000 and may cover the upper structure 1000.

The upper substrate BSU may include a material having a relatively high light transmittance. For example, the upper substrate BSU may include glass or plastic. In an embodiment, the upper substrate BSU may have flexibility, and thus the upper substrate BSU may be repeatedly folded or unfolded.

The color filter layer CF may be disposed on the upper substrate BSU. The color filter layer CF may selectively transmit light having a specific wavelength.

In an embodiment, the color filter layer CF may include a first color filter layer CF1, a second color filter layer CF2, and a third color filter layer CF. The first color filter layer CF1 may selectively transmit light having a first wavelength range, the second color filter layer CF2 may selectively transmit light having a second wavelength range, and the third color filter layer CF3 may selectively transmit light having a third wavelength range. For example, the first color filter layer CF1 may selectively transmit light having blue color, and the second color filter layer CF2 may selectively transmit light having red color, and the third color filter layer CF3 may selectively transmit light having green color.

In an embodiment, the first color filter layer CF1 may overlap the first accommodating opening OP1 and may not overlap the second accommodating opening OP2 and third accommodating opening OP3, and the second color filter layer CF2 may overlap the second accommodating opening OP2 and may not overlap the first accommodating opening OP1 and the third accommodating opening OP3, and the third color filter layer CF3 may overlap the third accommodating opening OP3 and may not overlap the first accommodating opening OP1 and the second accommodating opening OP2.

In an embodiment, in an area overlapping the first dummy opening OP_D1, the second dummy opening OP_D2, the fourth accommodating opening OP4, and the spacer area SPA, a first color filter layer CF1, a second color filter layer CF2, and a third color filter layer CF3 may be stacked on the upper substrate BSU. The area may be defined as a light blocking area through which light is not transmitted.

The refractive layer RL may be disposed on the color filter layer CF. The refractive layer RL may cover the color filter layer CF. The refractive layer RL may include a material having a relatively high refractive index and/or a material having a relatively low refractive index.

The protective layer PL may be disposed on the refractive layer RL. In an embodiment, the protective layer PL may include a silicon oxide. For example, the protective layer PL may include SiON.

The partition layer PW may be disposed on the protective layer PL. The partition layer PW may define the first accommodating opening OP1, the second accommodating opening OP2, the third accommodating opening OP3, the fourth accommodating opening OP4, the first dummy opening OP_D1, and the second dummy opening OP_D2. The partition layer PW may include a material having a relatively high light absorption rate. For example, the partition layer PW may include an organic material including a black dye.

The partition wall PW may define the spacer area SPA. An upper surface of the partition layer PW in the spacer area SPA may have an area equal to or greater than a predetermined or selectable area so that the spacer SPC may be formed to have a predetermined or selectable height. For example, a planar area of the upper surface of the partition layer PW in the spacer area SPA may be about 10% or more and about 40% or less of the planar area of the third accommodating opening OP3.

The first color conversion layer CCL1 may be disposed in the first accommodating opening OP1. The first color conversion layer CCL1 may include a scattering material SC and a first color conversion material CC1. The scattering material SC may include a material scattering light. For example, the scattering material SC may include $TiO_2$. The first color conversion material CC1 may include a material converting wavelength of light. For example, the first color conversion material CC1 may convert wavelength of light emitted from a first light emitting material EL1 (see FIG. 5) into a first wavelength. The first wavelength may be a wavelength within the first wavelength range. The light emitted from the first light emitting material EL1 may pass through the first color conversion layer CCL1 and the first color filter CF1 in sequence and may be visually recognized by the user of the display device DD.

The second color conversion layer CCL2 may be disposed in the second accommodating opening OP2. The second color conversion layer CCL2 may include the scattering material SC and a second color conversion material CC2. The second color conversion material CC2 may include a material converting wavelength of light. For example, the second color conversion material CC2 may convert wavelength of light emitted from a second light emitting material EL2 (see FIG. 5) into a second wavelength. The second wavelength may be a wavelength within the second wavelength range. The light emitted from the second light emitting material EL2 may pass through the second color conversion layer CCL2 and the second color filter CF2 in sequence and may be visually recognized by the user of the display device DD.

The capping layer CAP may cover the partition layer PW, the first color conversion layer CCL1, and the second color conversion layer CCL2. In an embodiment, the capping layer CAP and the protective layer PL may include a same material. For example, the capping layer CAP may include SiON.

The scattering layer SCL may be disposed in the third accommodating opening OP3. The scattering layer SCL may include the scattering material SC. In an embodiment, light emitted from a third light emitting material EL3 (see FIG. 5) may have a third wavelength, and the third wavelength may be a wavelength within the third wavelength range. The light emitted from the third light emitting material EL3 may pass through the scattering layer SCL and the third color filter layer CF in sequence and may be visually recognized by the user of the display device DD.

In an embodiment, in the third accommodating opening OP3, the capping layer CAP may be disposed between the partition wall PW and the scattering layer SCL. Light may be reflected at an interface between the scattering layer SCL and the capping layer CAP in the third accommodating opening OP3. Accordingly, light emitted from the third light emitting material EL3 and passing through the scattering layer SCL in the third accommodating opening OP3 may be reflected at the interface without being absorbed by the partition layer PW, and thus light efficiency of the display device DD may be improved.

In an embodiment, the scattering layer SCL may be further disposed in at least one of the first dummy opening OP_D1, the second dummy opening OP_D2, the central dummy opening OP_DC, and the peripheral dummy opening OP_DP. For example, as shown in FIG. 3, the scattering layer SCL may be disposed in each of the first dummy opening OP_D1, the second dummy opening OP_D2, the central dummy opening OP_DC, and the peripheral dummy opening OP_DP.

The spacer SPC may be disposed on the partition layer PW in the spacer area SPA. The spacer SPC and the scattering layer SCL may include a same material. The spacer SPC and the scattering layer SCL may be formed by a same process.

Figure 4:
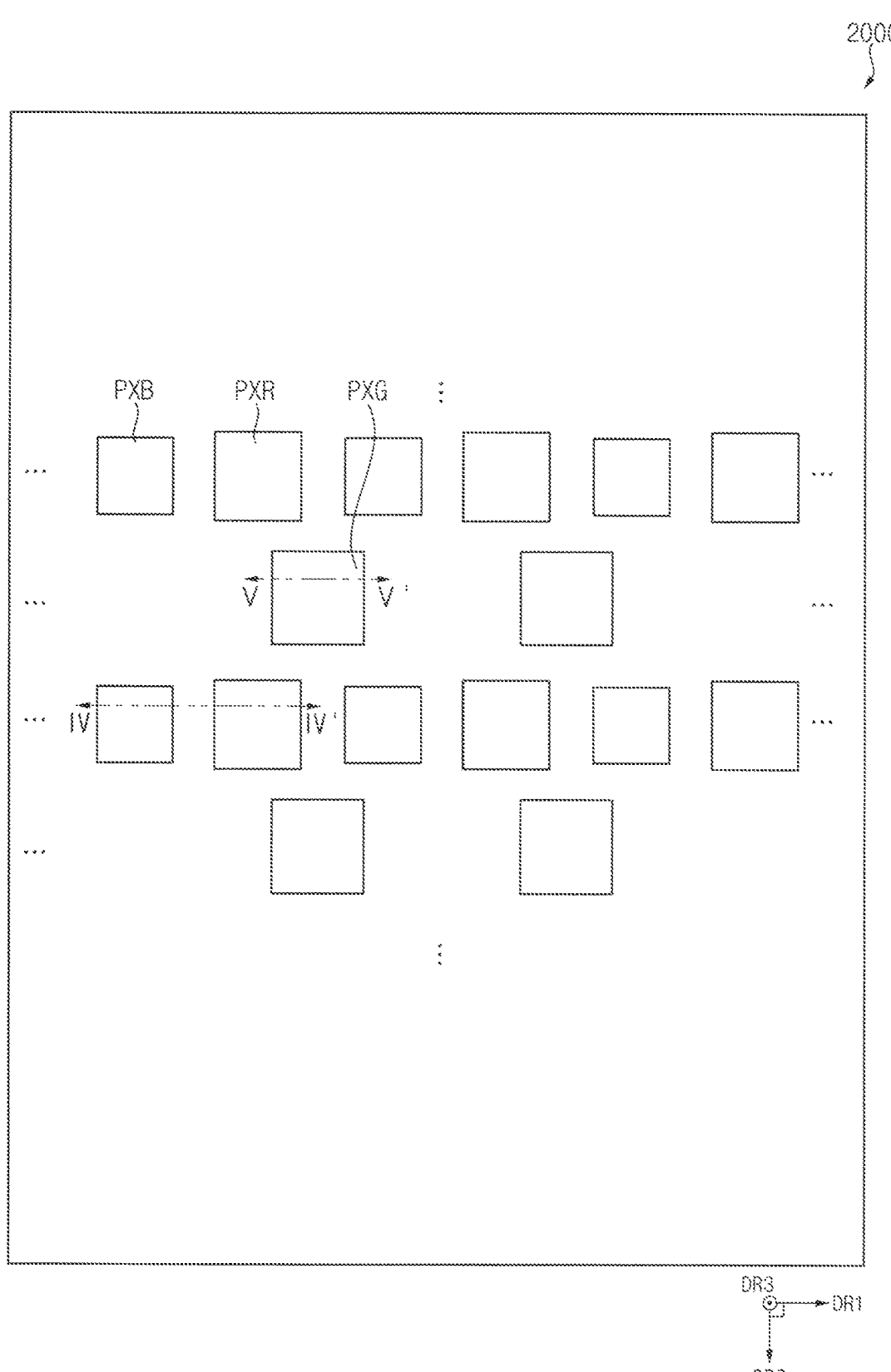
FIGS. 4 and 5 are schematic diagrams illustrating a lower structure included in the display device of FIG. 1.
Figure 5:
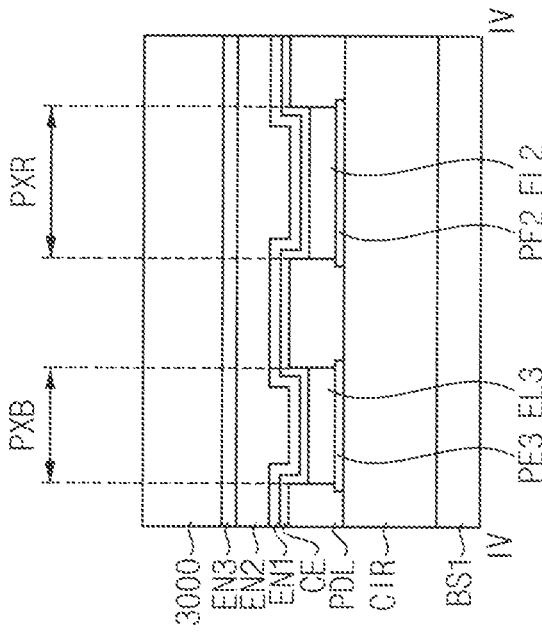

FIGS. 4 and 5 are schematic diagrams illustrating a lower structure 2000 included in the display device of FIG. 1. FIG. 4 is a schematic plan view illustrating the lower structure 2000 as viewed in a direction opposite to the third direction DR3, and FIG. 5 is a schematic cross-sectional view taken along lines IV-IV' and V-V' of FIG. 4.

Referring to FIG. 4, the lower structure 2000 may include pixel openings. Each of the pixel openings may correspond to the pixel which is a minimum unit for emitting light.

In an embodiment, the pixel openings may include a first pixel opening PXG, a second pixel opening PXR, and the third pixel opening PXB. The first pixel opening PXG may overlap the first accommodating opening OP1 of the upper structure 1000, the second pixel opening PXR may overlap the second accommodating opening OP2 of the upper structure 1000, and the third pixel opening PXB may overlap the third accommodating opening OP3 of the upper structure 1000.

The second pixel opening PXR and the third pixel opening PXB may be alternately arranged in the first direction DR1 to define a first pixel row. The first pixel opening PXG may be repeatedly arranged in the first direction DR1 to define a second pixel row. The first pixel row and the second pixel row may be alternately arranged in the second direction DR2.

Referring to FIGS. 4 and 5, the lower structure 2000 may include a lower substrate BS1, a circuit layer CIR, a first pixel electrode PE1, a second pixel electrode PE2, a third pixel electrode PE3, a first light emitting layer EL1, a second light emitting layer EL2, a third light emitting layer EL3, a pixel defining layer PDL, a common electrode layer CE, a first encapsulation layer EN1, a second encapsulation layer EN2, and a third encapsulation layer EN3. The filling layer 3000 may be disposed on the lower structure 2000 and may cover the lower structure 2000.

The lower substrate BS1 may include glass or plastic. In an embodiment, the lower substrate BS1 may have flexibility, and thus the lower substrate BS1 may be repeatedly folded or unfolded.

The circuit layer CIR may be disposed on the lower substrate BS1. The circuit layer CIR may include transistors. For example, the transistors may include a first transistor electrically connected to the first pixel electrode PE1, a second transistor electrically connected to the second pixel electrode PE2, and a third transistor electrically connected to the third pixel electrode PE3.

The first pixel electrode PE1, the second pixel electrode PE2, and the third pixel electrode PE3 may be disposed on the circuit layer CIR. In an embodiment, the first pixel electrode PE1, the second pixel electrode PE2, and the third pixel electrode PE3 may be referred to as an anode electrode.

The pixel defining layer PDL may be disposed on the circuit layer CIR. The pixel defining layer PDL may define a first pixel opening PXG exposing a portion of the first pixel electrode PE1, a second pixel opening PXR exposing a portion of the second pixel electrode PE2, and a third pixel opening PXB exposing a portion of the third pixel electrode PE3. The pixel defining layer PDL may include an organic material.

The first light emitting layer EL1 may be disposed in the first pixel opening PXG, the second light emitting layer EL2 may be disposed in the second pixel opening PXR, and the third light emitting layer EL3 may be disposed in the third pixel opening PXB. The first light emitting layer EL1, the second light emitting layer EL2, and the third light emitting layer EL3 may include a material emitting light. For example, the first light emitting layer EL1, the second light emitting layer EL2, and the third light emitting layer EL3 may include an organic light emitting material. In an embodiment, the first light emitting layer EL1, the second light emitting layer EL2, and the third light emitting layer EL3 may include a material emitting light of a substantially same wavelength. For example, the first light emitting layer EL1, the second light emitting layer EL2, and the third light emitting layer EL3 may include a material emitting light of the third wavelength.

The common electrode layer CE may be disposed on the pixel defining layer PDL. The common electrode layer CE may cover the pixel defining layer PDL, the first light emitting layer EL1, the second light emitting layer EL2, and the third light emitting layer EL3. In an embodiment, the common electrode layer CE may be referred as a cathode electrode.

The first encapsulation layer EN1 may be disposed on the common electrode layer CE. The first encapsulation layer EN1 may cover the common electrode layer CE. The first encapsulation layer EN1 may include an inorganic insulation material.

The second encapsulation layer EN2 may be disposed on the first encapsulation layer EN1. The second encapsulation layer EN2 may cover the first encapsulation layer EN1. The second encapsulation layer EN2 may include an organic insulation material.

The third encapsulation layer EN3 may be disposed on the second encapsulation layer EN2. The third encapsulation layer EN3 may cover the second encapsulation layer EN2. The third encapsulation layer EN3 may include an inorganic insulation material.

FIGS. 6 to 11 are schematic diagrams illustrating a method of manufacturing an upper structure of FIG. 3.

Figure 6:
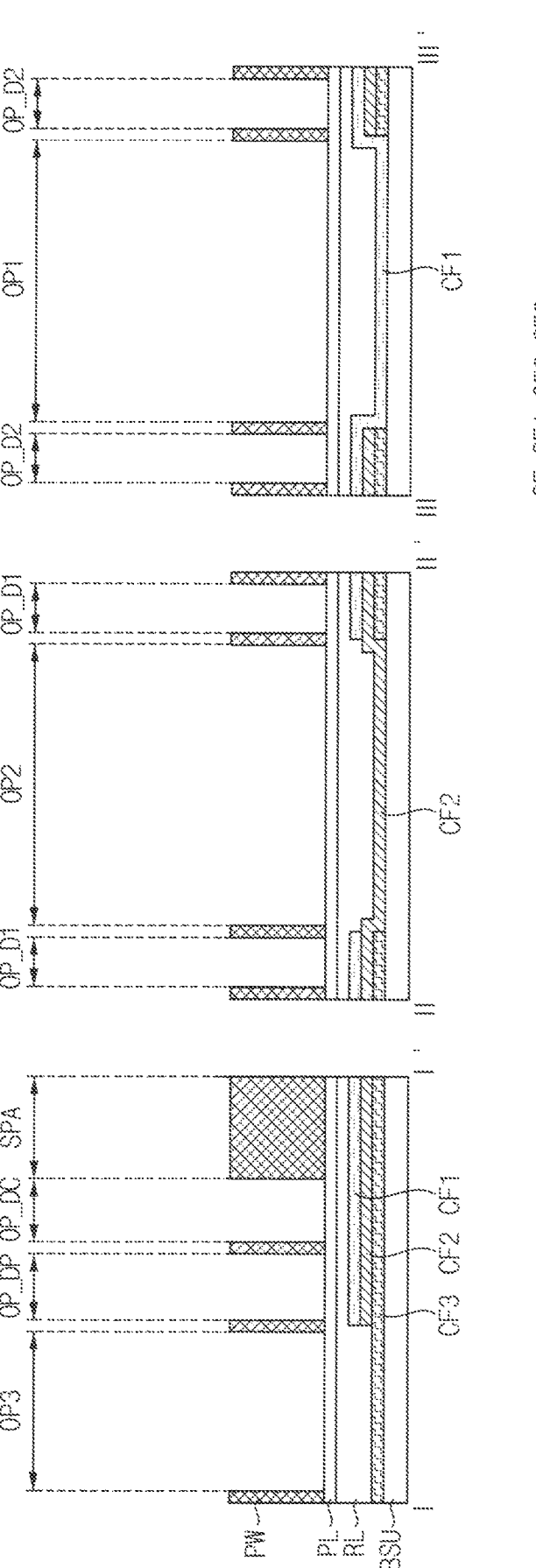

Referring to FIG. 6, the partition layer PW may be formed on the upper substrate BSU. The partition wall PW may define the first accommodating opening OP1, the second accommodating opening OP2, the third accommodating opening OP3, the first dummy opening OP_D1, the second dummy opening OP_D2, the central dummy opening OP_DC, and the peripheral dummy opening OP_DP. The partition layer PW may define the spacer area SPA.

A method of forming the partition layer PW on the upper substrate BSU is not limited, and various methods may be used to form the partition layer PW. For example, after entirely forming a pre-partition layer on the upper substrate BSU, a portion of the pre-partition layer may be removed to form the first accommodating opening OP1, the second accommodating opening OP2, the third accommodating opening OP3, the first dummy opening OP_D1, the second dummy opening OP_D2, the central dummy opening OP_DC, and the peripheral dummy opening OP_DP.

Figure 7:
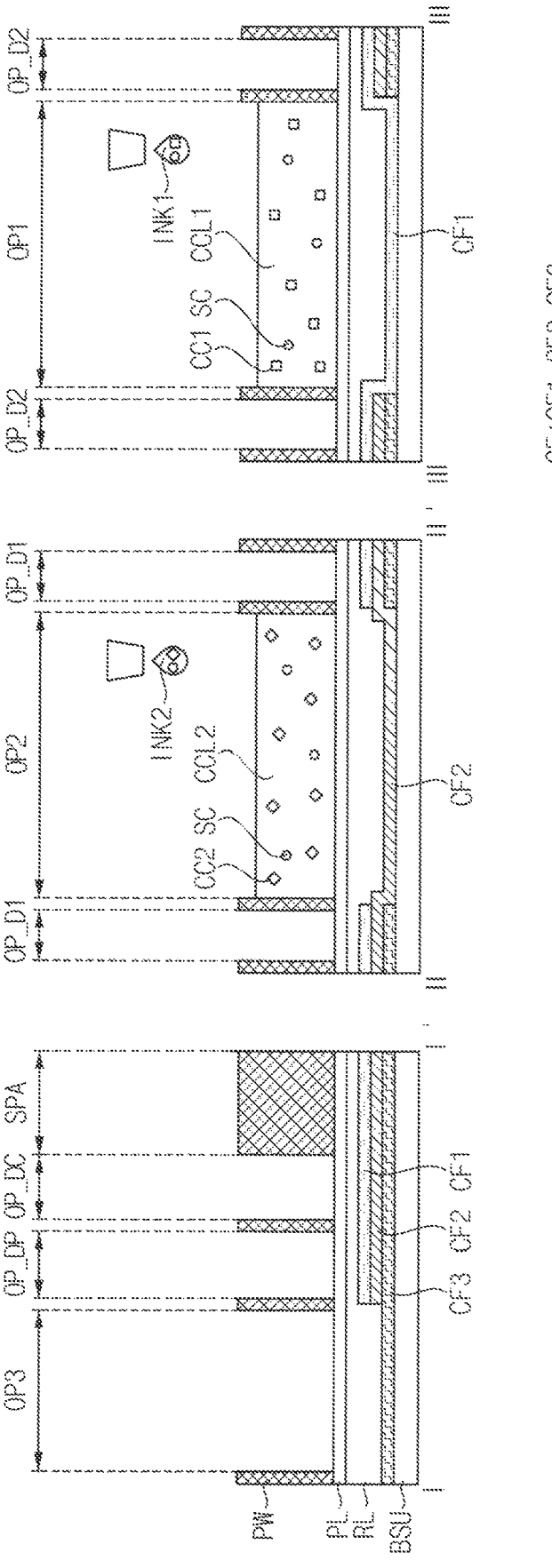

Referring to FIG. 7, the first color conversion layer CCL1 may be formed in the first accommodating opening OP1, and the second color conversion layer CCL2 may be formed in the second accommodating opening OP2. The forming of the first color conversion layer CCL1 and the forming of the second color conversion layer CCL2 may be performed separately, or may be performed substantially simultaneously.

In an embodiment, the first color conversion layer CCL1 may be formed by supplying a first ink INK1, including the first color conversion material CC1 and the scattering material SC, to the first accommodating opening OP1 by an inkjet method, and the second color conversion layer CCL2 may be formed by supplying a second ink INK2, including the second color conversion material CC2 and the scattering material SC, to the second accommodating opening OP2 by an inkjet method.

The first ink INK1 may be supplied outside the first accommodating opening OP1, and/or the second ink INK2 may be supplied outside the second accommodating opening OP2, due to an error in the inkjet process or misalignment of an inkjet head emitting the first ink INK1 and the second ink INK2. The first ink INK1 supplied outside the first accommodating opening OP1 may be referred to as a first erroneous ink, and the second ink INK2 supplied outside the second accommodating opening OP2 may be referred to as a second erroneous ink. In case that the first and the second erroneous inks remain on the partition wall PW and form protrusions, a display defect may occur in the display device DD.

In the disclosure, the partition wall PW may define the first dummy opening OP_D1, the second dummy opening OP_D2, the central dummy opening OP_DC, and the peripheral dummy opening OP_DP. Accordingly, the first erroneous ink and the second erroneous ink may be accommodated in the first dummy opening OP_D1, the second dummy opening OP_D2, the central dummy opening OP_DC, and/or the peripheral dummy opening OP_DP. Accordingly, it is possible to prevent the display defect of the display device DD due to the protrusions.

In the disclosure, as the partition wall PW defines the first dummy opening OP_D1, the second dummy opening OP_D2, the central dummy opening OP_DC, and the peripheral dummy opening OP_DP, an area of an upper surface of the partition wall PW may be relatively small. Accordingly, even if the first and second erroneous inks are dripped onto the upper surface of the partition wall PW, the size of the protrusions may be relatively small.

In the disclosure, the upper surface of the partition wall PW has an area equal to or greater than a predetermined or selectable area in the spacer area SPA, and accordingly, in case that the first and second erroneous inks are dripped onto the spacer area SPA of the partition wall PW, the protrusion may be formed to be relatively large.

To prevent this, the spacer area SPA of the partition wall PW may be spaced apart from the first accommodating opening OP1 and the second accommodating opening OP2. In other words, at least one of the first dummy opening OP_D1, the second dummy opening OP_D2, the central dummy opening OP_DC, and the peripheral dummy opening OP_DP may be positioned between the spacer area SPA, the first accommodating opening OP1, and the second accommodating opening OP2.

In an embodiment, the spacer area SPA may be defined as a portion of the partition wall PW adjacent to the central dummy opening OP_DC. The peripheral dummy opening OP_DP may be positioned between the spacer area SPA and the first accommodating opening OP1, and between spacer area SPA and the second accommodating opening OP2.

Figure 8:
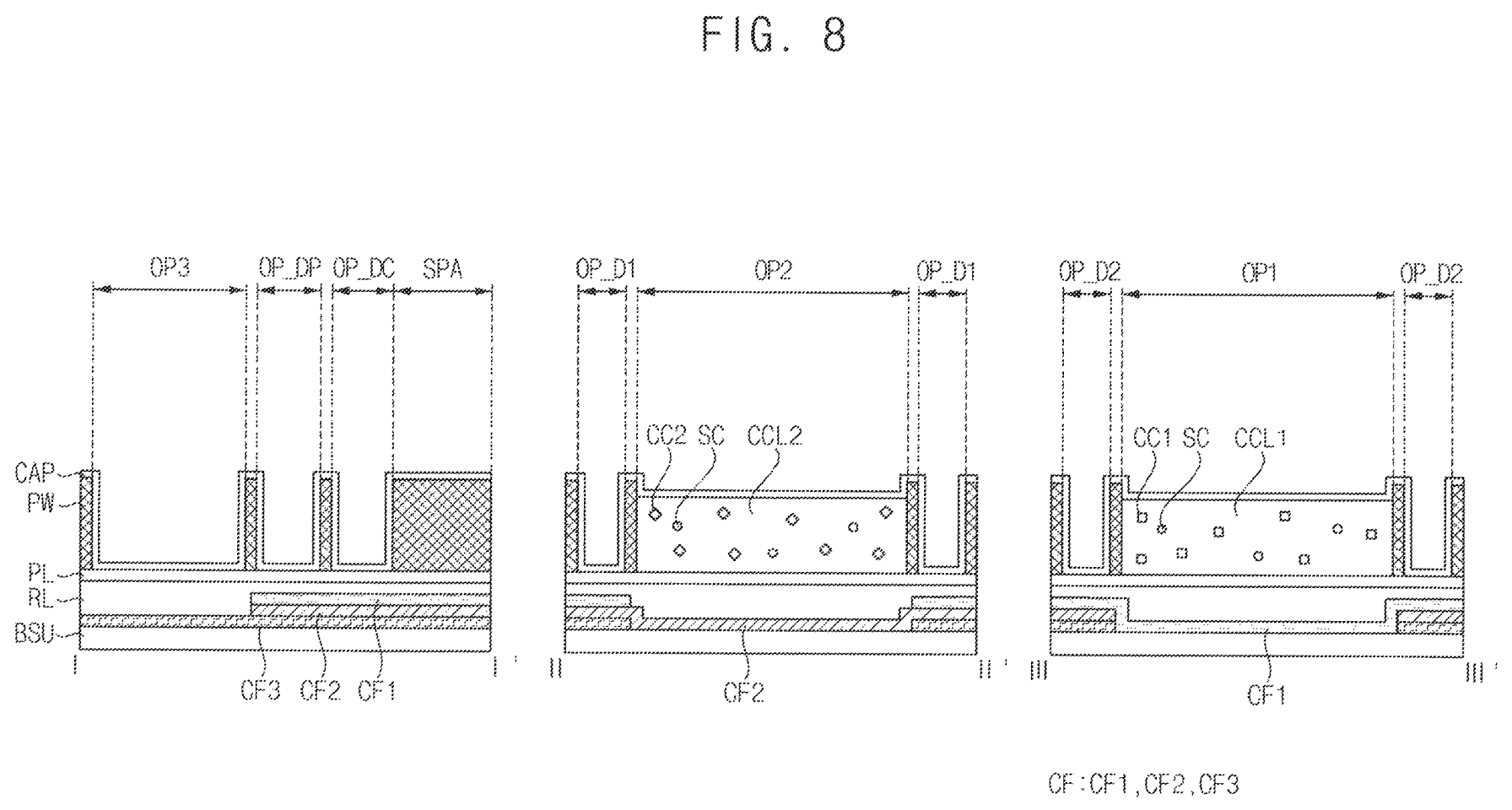

Referring to FIG. 8, the capping layer CAP may be formed on the upper substrate BSU. The capping layer CAP may cover the partition wall PW, the first color conversion layer CCL1, and the second color conversion layer CCL2. A method of forming the capping layer CAP is not limited, and various methods may be used to form the capping layer CAP.

Figure 9:
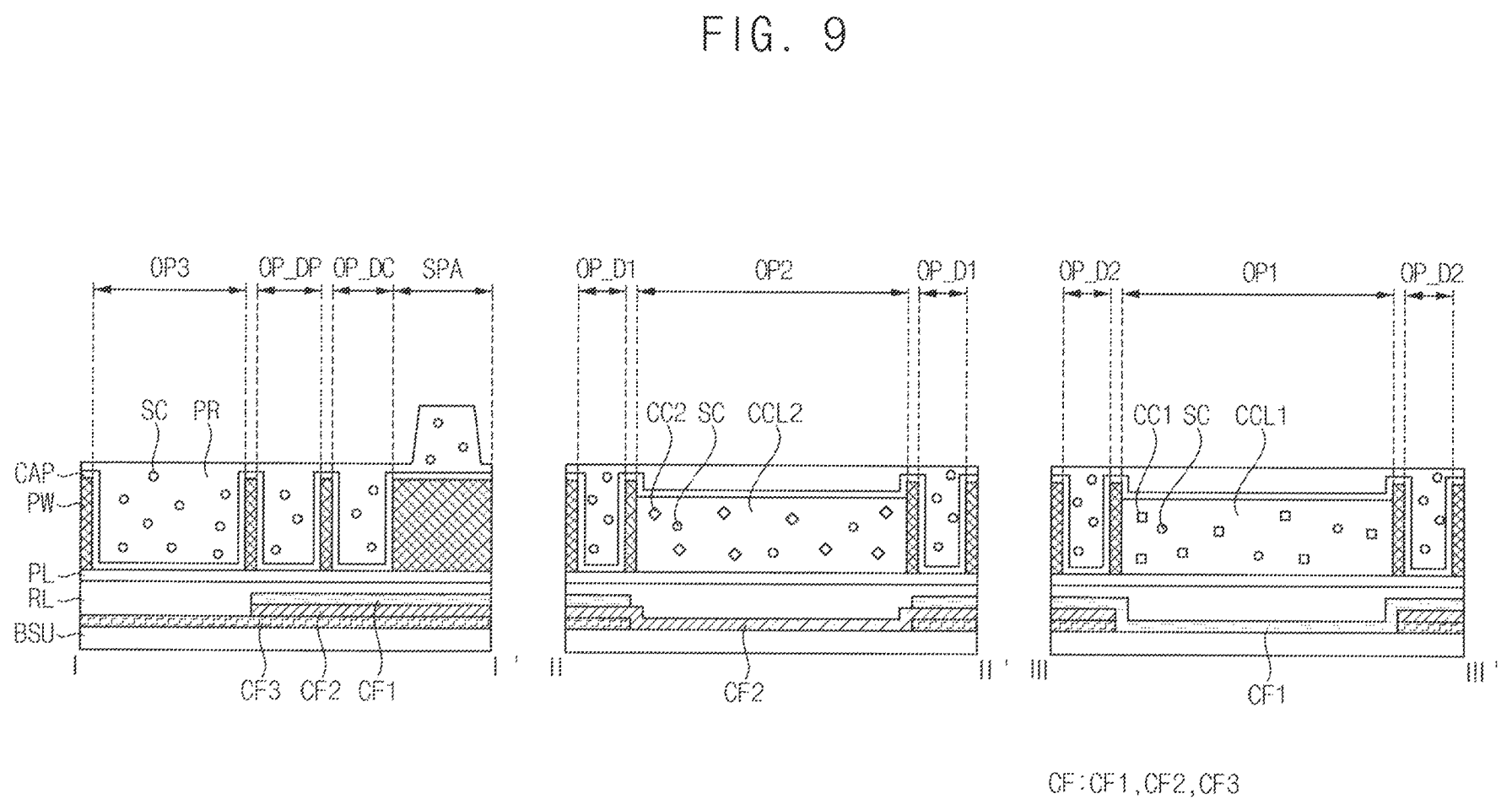

Referring to FIG. 9, a photoresist material PR may be applied on the upper substrate BSU. The photoresist material PR may include the scattering material SC.

In an embodiment, the photoresist material PR may be entirely applied on the upper substrate BSU. The photoresist material PR may be disposed in the third accommodating opening OP3, the first dummy opening OP_D1, the second dummy opening OP_D2, the peripheral dummy opening OP_DP, and the central dummy opening OP_DC.

In an embodiment, the photoresist material PR applied on the spacer area SPA of the partition wall PW may form a protrusion. For example, in case that the photoresist material PR may include a material having relatively large viscosity, the protrusion may be formed on the spacer area SPA of the partition wall PW by entirely applying the photoresist material PR on the upper substrate BSU.

Referring to FIG. 10, after removing a portion of the photoresist material PR to simultaneously form the scattering layer SCL and the spacer SPC, the filling layer 3000 covering the upper substrate 1000 may be formed.

For example, in case that the photoresist material PR may include a positive type photoresist material, after a portion of the photoresist material PR overlapping the first accommodating opening OP1 and the second accommodating opening OP2 is exposed, the exposed portion of the photoresist material PR may be developed. The photoresist material PR disposed in the third accommodating opening OP3, the first dummy opening OP_D1, the second dummy opening OP_D2, the peripheral dummy opening OP_DP, and the central dummy opening OP_DC may form the scattering layer SCL, and the protrusion formed on the spacer area SPA of the partition wall PW may form the spacer SPC.

In another example, in case that the photoresist material PR may include a negative type photoresist material, after a portion of the photoresist material PR which does not overlap the first accommodating opening OP1 and the second accommodating opening OP2 is exposed, the unexposed portion of the photoresist material PR may be developed. The photoresist material PR disposed in the third accommodating opening OP3, the first dummy opening OP_D1, the second dummy opening OP_D2, the peripheral dummy opening OP_DP, and the central dummy opening OP_DC may form the scattering layer SCL, and the protrusion formed on the spacer area SPA of the partition wall PW may form the spacer SPC.

In still another example, in case that the photoresist material PR may include a positive type photoresist material, a first portion of the photoresist material PR overlapping the first accommodating opening OP1 and the second accommodating opening OP2 may be exposed through a transmissive portion of a halftone mask, a second portion of the photoresist material PR overlapping the third accommodating opening OP3, the first dummy opening OP_D1, the second dummy opening OP_D2, the peripheral dummy opening OP_DP, and the central dummy opening OP_DC may be exposed through a transflective portion of the halftone mask, and the exposed first and second portions may be developed.

Referring to FIG. 11, after the scattering layer SCL and the spacer SPC are formed, the filling layer 3000 may be formed. A method of forming the filling layer 3000 is not limited, and various methods may be used to form the filling layer 3000.

In an embodiment, the scattering layer SCL may be disposed in the first dummy opening OP_D1, the second dummy opening OP_D2, the peripheral dummy opening OP_DP, and the central dummy opening OP_DC, and accordingly, the filling layer 3000 may be disposed on the scattering layer SCL disposed in the first dummy opening OP_D1, the second dummy opening OP_D2, the peripheral dummy opening OP_DP, and the central dummy opening OP_DC. Accordingly, an amount of the filling layer 3000 required to cover the upper substrate 1000 may be relatively reduced, and the cost of manufacturing the display device DD may be relatively reduced.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a substrate;
   a partition layer disposed on the substrate, and comprising:
      a first accommodating opening;
      a second accommodating opening;
      a third accommodating opening; and
      a spacer area spaced apart from the first accommodating opening and the second accommodating opening;
   a first color conversion layer disposed in the first accommodating opening;
   a second color conversion layer disposed in the second accommodating opening;
   a scattering layer disposed in the third accommodating opening; and
   a spacer disposed on the spacer area of the partition layer,
   wherein the spacer and the scattering layer comprise a same material, and
   wherein the scattering layer and the spacer comprise a scattering material.

2. The display device of claim 1, wherein the partition layer further comprises:
   a first dummy opening disposed between the second accommodating opening and the third accommodating opening; and
   a second dummy opening disposed between the first accommodating opening and the second accommodating opening and between the first accommodating opening and the third accommodating opening.

3. The display device of claim 2, wherein the scattering layer is further disposed in the first dummy opening and the second dummy opening.

4. The display device of claim 1, wherein the partition wall further comprises a fourth accommodating opening,
   wherein the fourth accommodating opening is surrounded by the first accommodating opening, the second accommodating opening, and the third accommodating opening, and comprises a central dummy opening and a plurality of peripheral dummy openings surrounding the central dummy opening.

5. The display device of claim 4, wherein the spacer area is a portion of the partition wall adjacent to the central dummy opening.

6. The display device of claim 4, wherein the scattering layer is further disposed in the fourth accommodating opening.

7. The display device of claim 1, further comprising:
   a capping layer covering the partition wall, the first color conversion layer, and the second color conversion layer.

8. The display device of claim 7, wherein the capping layer is further disposed between the partition wall and the scattering layer in the third accommodating opening.

9. The display device of claim 1, wherein
   a planar area of the first accommodating opening is larger than a planar area of the second accommodating opening, and the planar area of the second accommodating opening is larger than a planer area of the third accommodating opening.

10. The display device of claim 1, further comprising:

a filling layer covering the partition wall, the first color conversion layer, the second color conversion layer, the scattering layer, and the spacer.

11. A method of manufacturing a display device, comprising:

forming a pre-partition wall on a substrate;

forming a partition wall comprising a first accommodating opening, a second accommodating opening, a third accommodating opening, and a spacer area spaced apart from the first accommodating opening and the second accommodating opening by removing a first portion of the pre-partition wall;

forming a first color conversion layer in the first accommodating opening;

forming a second color conversion layer in the second accommodating opening;

applying a photoresist material entirely on the substrate to cover the partition wall, the first color conversion layer, and the second color conversion layer; and forming a scattering layer disposed in the third accommodating opening and a spacer disposed on the spacer area of the partition wall at the same time by removing a portion of the photoresist material, wherein the photoresist material comprises a scattering material.

12. The method of claim 11, wherein the forming of the first color conversion layer comprises supplying a first ink comprising a first color conversion material into the first accommodating opening by an inkjet method, and the forming of the second color conversion layer comprises supplying a second ink comprising a second color conversion material into the second accommodating opening by an inkjet method.

13. The method of claim 12, wherein the forming of the partition wall further comprises:

forming a first dummy opening disposed between the second accommodating opening and the third accommodating opening, and a second dummy opening disposed between the first accommodating opening and the third accommodating opening by removing second portion of the pre-partition wall.

14. The method of claim 13, wherein the forming of the partition wall further comprises:

forming a fourth accommodating opening surrounded by the first accommodating opening, the second accommodating opening, and the third accommodating opening, and comprising a central dummy opening and a plurality of peripheral dummy openings surrounding the central dummy opening by removing a third portion of the pre-partition wall.

15. The method of claim 14, wherein the scattering layer is further disposed in the first dummy opening, the second dummy opening, and the fourth accommodating opening.

16. The method of claim 12, further comprising:

forming a filling layer covering the partition wall, the first color conversion layer, the second color conversion layer, the scattering layer, and the spacer.

17. The method of claim 11, further comprising:

after the forming of the second color conversion layer, forming the capping layer covering the substrate, the partition wall, the first color conversion layer, and the second color conversion layer.

18. The method of claim 17, wherein the photoresist material is applied onto the capping layer.

*     *     *     *     *